United States Patent
Chang et al.

(10) Patent No.: US 8,105,914 B2
(45) Date of Patent: Jan. 31, 2012

(54) METHOD OF FABRICATING ORGANIC MEMORY DEVICE

(75) Inventors: Chia-Chieh Chang, Taipei (TW); Zing-Way Pei, Taichung (TW); Wen-Miao Lo, Kaohsiung (TW)

(73) Assignee: Industrial Technology Research Institute, Hsinchu (TW)

( * ) Notice: Subject to any disclaimer, the term of this patent is extended or adjusted under 35 U.S.C. 154(b) by 45 days.

(21) Appl. No.: 12/465,664

(22) Filed: May 14, 2009

(65) Prior Publication Data
US 2009/0221113 A1   Sep. 3, 2009

Related U.S. Application Data

(62) Division of application No. 11/309,357, filed on Jul. 31, 2006, now abandoned.

(30) Foreign Application Priority Data

Jan. 11, 2006 (TW) ................................ 95101034 A

(51) Int. Cl.
*H01L 21/20* (2006.01)

(52) U.S. Cl. ........... 438/396; 438/99; 438/253; 438/780
(58) Field of Classification Search .............. 438/99, 438/253, 396, 780
See application file for complete search history.

(56) References Cited

U.S. PATENT DOCUMENTS

| 7,078,240 B2* | 7/2006 | Li et al. .............................. 438/3 |
| 2004/0026729 A9* | 2/2004 | Krieger et al. ................. 257/306 |
| 2005/0249975 A1* | 11/2005 | Sandberg et al. ............. 428/690 |
| 2005/0274943 A1* | 12/2005 | Chen ................................ 257/40 |
| 2006/0131560 A1* | 6/2006 | Yang et al. ....................... 257/40 |

* cited by examiner

*Primary Examiner* — Kevin M Picardat
*Assistant Examiner* — Bac Au
(74) *Attorney, Agent, or Firm* — Jianq Chyun IP Office

(57) ABSTRACT

A method of fabricating an organic memory device is provided. In the method, a bottom electrode is formed on a substrate. A first surface treatment is performed on the bottom electrode to form a bottom surface treatment layer on a surface thereof. A polymer thin film is formed on the bottom surface treatment layer, and a top electrode is formed on the polymer thin film.

4 Claims, 2 Drawing Sheets

METHOD OF FABRICATING ORGANIC MEMORY DEVICE

CROSS-REFERENCE TO RELATED APPLICATION

This application is a divisional of and claims priority benefit of U.S. non-provisional application Ser. No. 11/309,357, filed on Jul. 31, 2006, now pending, which claims the priority benefit of Taiwan application serial no. 95101034, filed on Jan. 11, 2006. The entirety of each of the above-mentioned patent applications is hereby incorporated by reference herein and made a part of this specification.

BACKGROUND OF THE INVENTION

1. Field of the Invention

The present invention relates to an organic memory device and a method of fabricating the same. More particularly, the present invention relates to an organic memory device with high device reliability and a method of fabricating the same.

2. Description of Related Art

With the approach of the nanometer age, recently a new nanometer memory with a larger storage capacity, higher speed, and better performance and adaptability has attracted much attention. Among various new non-volatile memories, one of the most interesting memories is the organic memory.

The organic memory utilizes the memory effect of organic materials to store data. Therefore, all organic materials with bistable memory effects may be used in memory devices. The technique that employs organic polymer thin films to fabricate organic memories is under rapid development, and may be combined with the existing film coating techniques in the industry. For example, multilayer organic films structure comprising multiple organic polymer thin films may be fabricated to form high density memories using the existing mature semiconductor process. Moreover, the organic memory has an additional advantageous feature that other nanometer memory techniques, such as magnetic memory and phase change memory, do not possess, i.e., low-cost flexible memories and electronic devices can be fabricated by applying non-semiconductor film coating techniques (e.g. processes of an evaporation technique for OLED, a screen coating technique, or an inkjet technique) with soft materials or surfaces of irregular objects used as substrates.

However, there exist difficulties in reading and writing memory devices formed of organic materials and non-organic materials (e.g. metal electrodes) due to the poor electrical property caused by the contact interface.

SUMMARY OF THE INVENTION

The present invention is directed to an organic memory device, wherein the adhesion between the metal electrodes and the polymer thin film is improved.

The present invention is directed to a method of fabricating the organic memory device, wherein the interface between the metal electrodes and the polymer thin film may be improved. Thus, the interface between the metal electrodes and the polymer thin film may be stabilized and the number of carrier traps caused by interface defects may be reduced.

The present invention provides an organic memory device comprising a top electrode, a bottom electrode and a polymer thin film. The polymer thin film is disposed between the top electrode and bottom electrode. The memory device further includes a bottom surface treatment layer between the polymer thin film and the bottom electrode, so as to form a stable interface.

According to an exemplary embodiment of the present invention, the aforementioned bottom surface treatment layer includes a metal oxide layer, a metal nitride layer, a silicon oxide layer or an organic self-assembling polymer layer.

According to an exemplary embodiment of the present invention, the top electrode and bottom electrode may comprise a metal. The bottom electrode may comprise aluminum or copper.

According to an exemplary embodiment of the present invention, the aforementioned polymer thin film may comprise a bistable structure.

According to an exemplary embodiment of the present invention, the organic memory device further comprises an additional top surface treatment layer disposed between the polymer thin film and the top electrode.

The present invention also provides a method of fabricating the organic memory device including forming a bottom electrode on a substrate; performing a first surface treatment on the bottom electrode to form a bottom surface treatment layer on the surface of the bottom electrode; forming a polymer thin film on the surface treatment layer; and forming a top electrode on the polymer thin film.

According to an exemplary embodiment of the present invention, the first surface treatment comprises, for example an oxidation treatment including an $O_2$ plasma treatment or a nitridation treatment including an $N_2$ plasma treatment or an $NH_3$ plasma treatment.

According to an exemplary embodiment of the present invention, the aforementioned first surface treatment includes a thermal treatment performed in oxygen, nitrogen, or an ammonia gas atmosphere.

According to an exemplary embodiment of the present invention, the first surface treatment applied to the bottom electrode includes depositing or coating the aforementioned bottom surface treatment layer on the bottom electrode. The bottom surface treatment layer comprises a silicon oxide layer or a silicon nitride layer or an organic self-assembling polymer.

According to an exemplary embodiment of the present invention, the polymer thin film may be optionally subjected to a second surface treatment, after the aforementioned polymer thin film is formed but before the top electrode is formed so as to form a second top surface treatment layer over the surface of the polymer thin film. The surface treatment may also stabilize the interface between the organic thin film and the inorganic conductor. Preferably, the top surface treatment is completed at a temperature below the glass transition temperature of the polymer thin film. Furthermore, the surface treatment includes introducing a reaction gas containing oxygen, nitrogen or ammonia before the formation of the top electrode, so that the interface between the polymer thin film and the top electrode is an oxide interface or a nitride interface. Alternatively, the top surface treatment layer may be deposited or coated on the polymer thin film. The top surface treatment layer comprises a silicon oxide layer or a silicon nitride layer or a self-assembling silicon oxide layer.

According to an exemplary embodiment of the present invention, the top electrode and bottom electrode may comprise a metal. In addition, the polymer thin film comprises a bistable structure.

According to an exemplary embodiment of the present invention, a bottom surface treatment layer is added into the structure of the organic memory in order to stabilize the interface between the polymer thin film and the bottom electrode and thereby reduce the number of carrier traps caused by interface defects. Furthermore, the adhesion between the metal electrodes and the polymer thin film may also be improved. Thus, the reliability of the device may be effectively promoted.

In order to the make aforementioned and other objects, features and advantages of the present invention comprehensible, preferred embodiments accompanied with figures are described in detail below.

It is to be understood that both the foregoing general description and the following detailed description are exemplary, and are intended to provide further explanation of the invention as claimed.

DESCRIPTION OF EMBODIMENTS

Figure 1A:
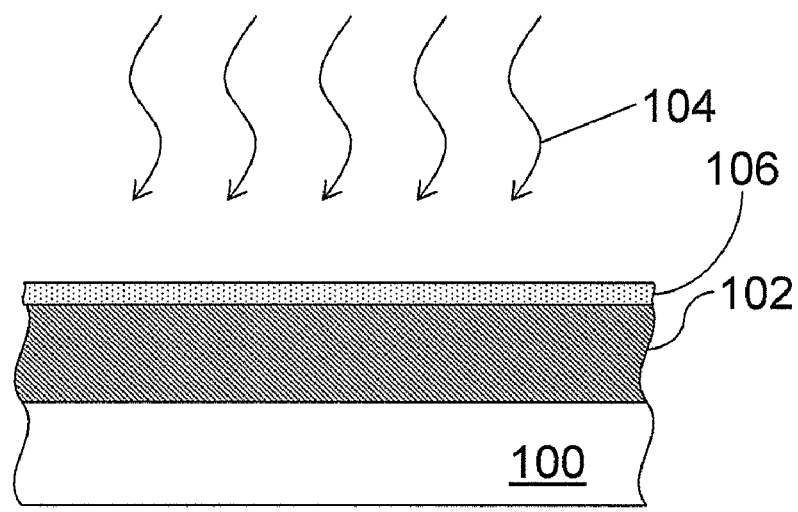
FIGS. 1A-1C are sectional views illustrating the process steps of fabricating an organic memory device in accordance with an exemplary embodiment of the present invention.
Figure 1B:
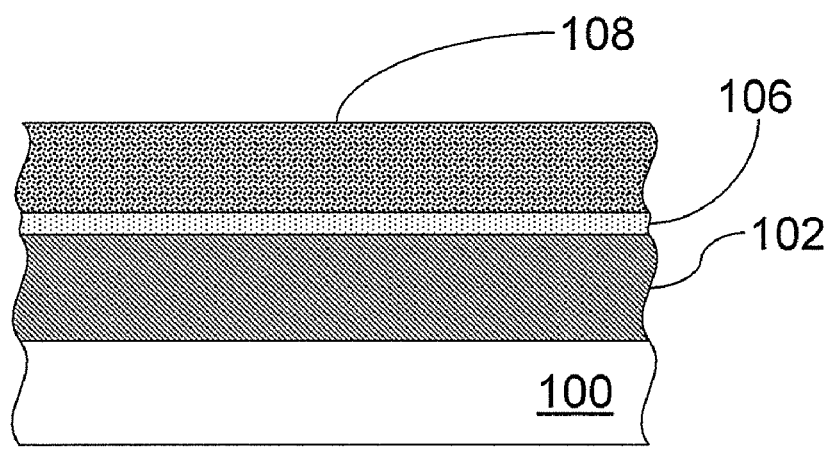
Figure 1C:
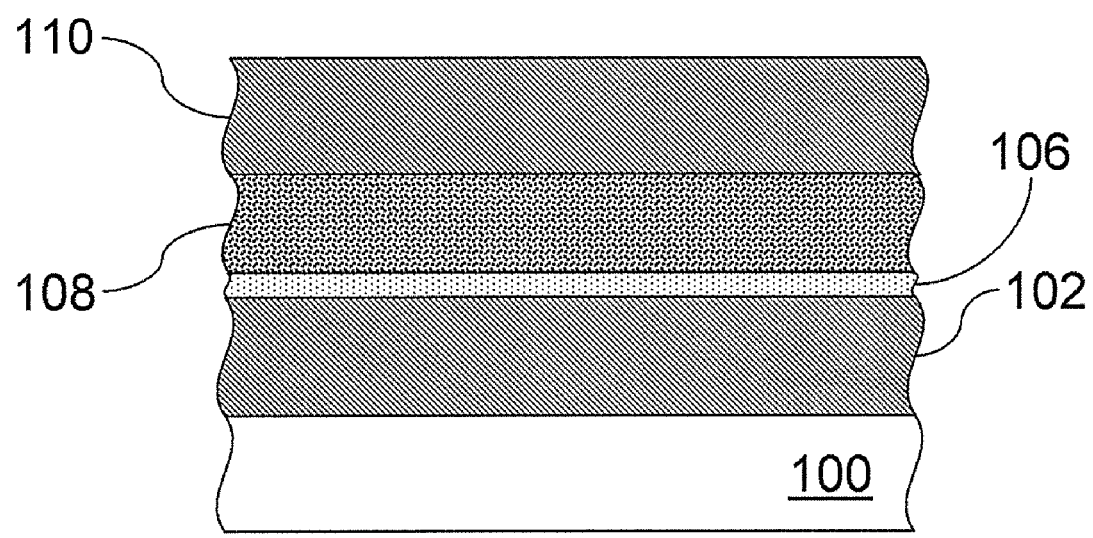

FIGS. 1A-1C are sectional views illustrating the process steps of fabricating an organic memory device in accordance with an exemplary embodiment of the present invention.

Referring to FIG. 1A, a layer of bottom electrode 102 comprised of aluminum or copper is formed on a substrate 100. Next, the bottom electrode 102 is treated with a first surface treatment 104 to form a bottom surface treatment layer 106 on the surface of the bottom electrode 102, wherein the thickness of the bottom surface treatment layer 106 is below several tens of nanometers according to the device design requirement. The first surface treatment 104 comprises, for example, an oxidation treatment including an $O_2$ plasma treatment or a nitridation treatment including, an $N_2$ plasma treatment or an $NH_3$ plasma treatment. In addition, the aforementioned first surface treatment 104 may also include a thermal treatment in oxygen, nitrogen, or ammonia gas atmosphere. Furthermore, the first surface treatment 104 applied to the bottom electrode 102 may also includes depositing or coating the bottom surface treatment layer 106, for example, a silicon oxide layer, a silicon nitride layer or an organic self-assembling polymer on the bottom electrode 102. The bottom surface treatment layer 106 formed by the aforementioned first surface treatment 104 in spite of using the above method or any other method, includes a metal oxide layer, a metal nitride layer, a silicon oxide layer, a silicon nitride layer, or an organic self-assembling polymer layer.

Next, referring to FIG. 1B, a layer of polymer thin film 108 is formed on the bottom surface treatment layer 106 using an evaporation technique, a screen coating technique or an inkjet technique, and the thickness of the polymer thin film 108 may be several tens of nanometers depending on the device design requirement. The layer of polymer thin film 108 comprises, for example, a bistable structure including a mixture of polystyrene (PS), 8-hydroxyquinoline (8HQ) and Au, or any bistable organic substances.

Next, referring to FIG. 1C, a top electrode 110 is formed on the polymer thin film 108, wherein the material of the top electrode 110 includes metal. The structure shown in FIG. 1C is the organic memory device of the preferred embodiment of the present invention.

Additionally, the top electrode 110 may be formed on a optional top surface treatment layer (not shown) that is formed by treating the polymer thin film 108 with a second surface treatment, wherein the thickness of the top surface treatment layer is below several tens of nanometers according to the device design requirement. The aforementioned second surface treatment includes, for example, introducing a reaction gas containing oxygen, nitrogen or ammonia before the formation of the top electrode 110, such that the interface between the polymer thin film 108 and the top electrode 110 may be an oxide interface or a nitride interface. Furthermore, the aforementioned second surface treatment applied to the polymer thin film 108 may also include depositing or coating a top surface treatment layer, for example, a silicon oxide layer, a silicon nitride layer, or a self-assembling silicon oxide layer on the polymer thin film 108. Preferably, the aforementioned second surface treatment is performed at a temperature below the glass transition temperature of polymer thin film 108. The top surface treatment layer formed by the aforementioned second surface treatment in spite of by using the above method or any other method, includes a metal oxide layer, a metal nitride layer, a silicon oxide layer, a silicon nitride layer, or an organic self-assembling polymer layer.

To sum up, the present invention is characterized in disposing the bottom surface treatment layer between the polymer thin film and the bottom surface treatment layer of the bottom electrode to improve the stability of the interface. Furthermore, a top surface treatment layer may be optionally formed between the polymer thin film and the top electrode. Thus, the number of carrier traps caused by interface defects may be effectively reduced, and the adhesion between metal electrodes and the polymer thin film may be promoted. Thus, the reliability of the organic memory device may be effectively promoted.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method of fabricating an organic memory device, comprising:
    forming a bottom electrode on a substrate;
    performing a first surface treatment on the bottom electrode to form a bottom surface treatment layer on a surface thereof;
    forming a polymer thin film on the bottom surface treatment layer;
    performing a second surface treatment on the polymer thin film to form a top surface treatment layer on the polymer thin film, wherein the second surface treatment includes introducing a reaction gas containing nitrogen or ammonia to make the interface between the polymer thin film and the top electrode to be a nitride interface; and
    forming a top electrode on the top surface treatment layer.

2. The method as claimed in claim 1, wherein the second surface treatment is performed at a temperature below melting point of the polymer thin film.

3. The method as claimed in claim 1, wherein the top electrode and the bottom electrode include metal.

4. The method as claimed in claim 1, wherein the polymer thin film comprises a bistable structure.

* * * * *